(12) United States Patent
Otterstedt et al.

(10) Patent No.: US 9,251,864 B2
(45) Date of Patent: Feb. 2, 2016

(54) SYSTEM AND METHOD FOR PROVIDING VOLTAGE SUPPLY PROTECTION IN A MEMORY DEVICE

(75) Inventors: Jan Otterstedt, Unterhaching (DE); Wolf Allers, Munich (DE); Mihail Jefremow, Augsburg (DE); Edvin Paparisto, Munich (DE); Leonardo Castro, Munich (DE); Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 430 days.

(21) Appl. No.: 13/605,129

(22) Filed: Sep. 6, 2012

(65) Prior Publication Data

US 2014/0064011 A1    Mar. 6, 2014

(51) Int. Cl.
*G11C 29/04* (2006.01)
*G11C 29/02* (2006.01)
*G11C 5/14* (2006.01)

(52) U.S. Cl.
CPC ............. *G11C 5/143* (2013.01); *G11C 29/02* (2013.01); *G11C 29/04* (2013.01)

(58) Field of Classification Search
CPC ...... G11C 16/26; G11C 7/1006; G11C 11/56; G11C 11/5678; G11C 29/028; G11C 7/106; G11C 7/02; G11C 11/5642; G11C 29/023; G11C 29/02; G11C 7/1051; G11C 7/067; G11C 7/1069; G11C 16/04; G11C 13/0004; G11C 2211/5634; G11C 5/143; G11C 29/04
USPC .......... 365/185.18, 185.23, 189.06, 200, 201, 365/228
See application file for complete search history.

(56) References Cited

U.S. PATENT DOCUMENTS

| | | | |
|---|---|---|---|
| 6,097,636 A * | 8/2000 | Nojima | 365/185.23 |
| 6,349,061 B1 * | 2/2002 | Yoneyama et al. | 365/185.29 |
| 6,396,743 B1 * | 5/2002 | Nguyen | 365/185.23 |
| 2006/0203599 A1 * | 9/2006 | Doyle et al. | 365/230.06 |

* cited by examiner

*Primary Examiner* — (John) J. H. Hur
(74) *Attorney, Agent, or Firm* — Eschweiler & Associates, LLC

(57) ABSTRACT

The invention relates to an electronic memory system, and more specifically, to a system for providing voltage supply protection in a memory device, and a method for providing voltage supply protection in a memory device. According to an embodiment, a system for providing voltage supply protection in a memory device is provided, the system including a memory array including a plurality of memory cells arranged in a plurality of groups of memory cells, and a plurality of current limiting elements, wherein each group of memory cells is associated with at least one current limiting element.

25 Claims, 5 Drawing Sheets

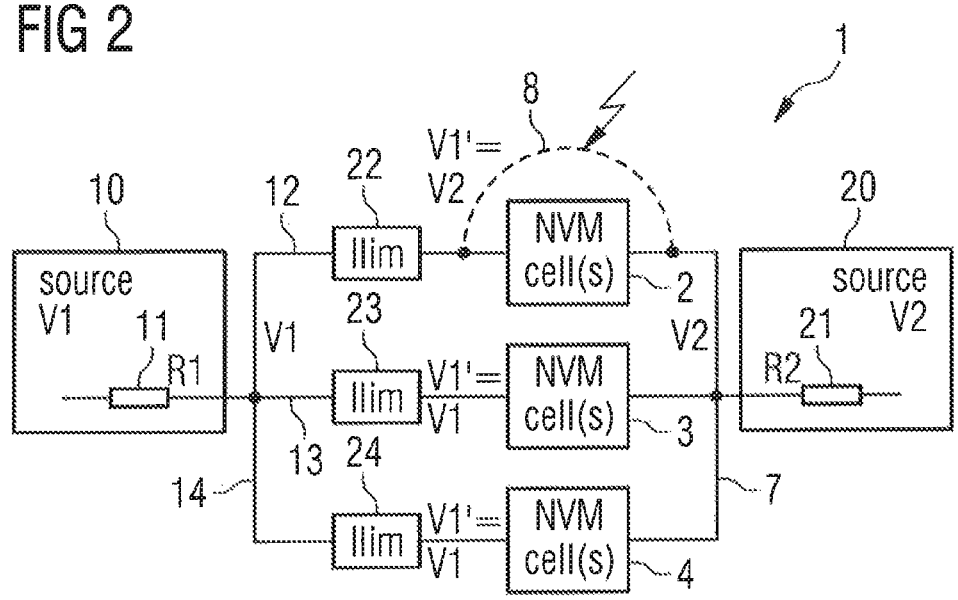

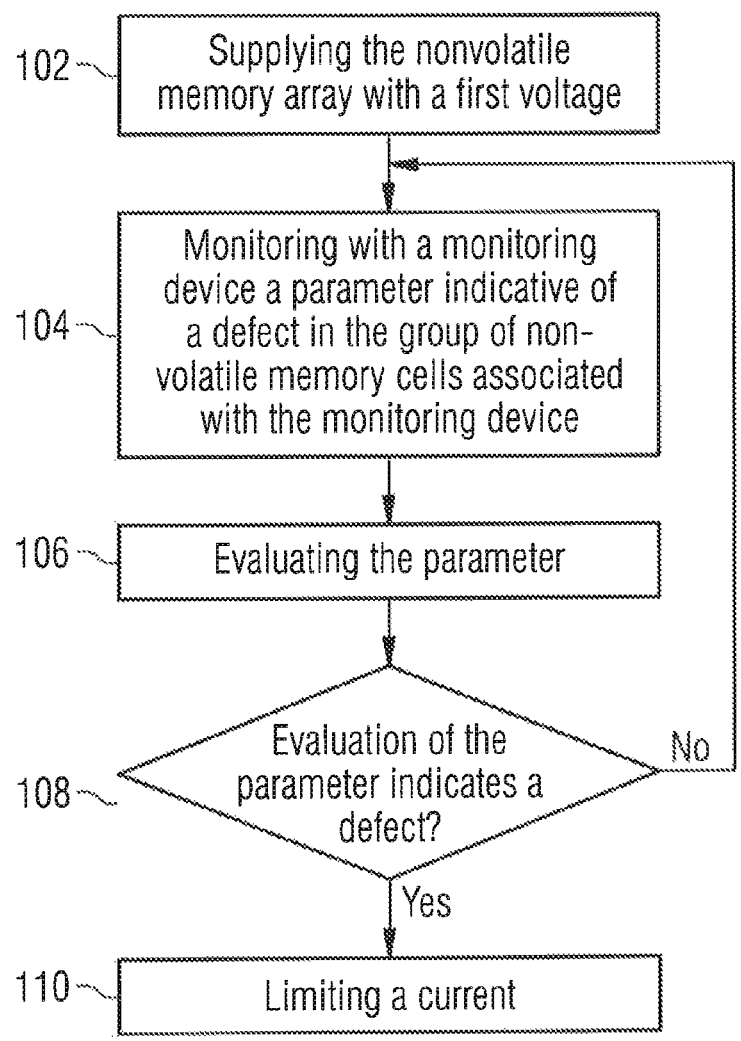

SYSTEM AND METHOD FOR PROVIDING VOLTAGE SUPPLY PROTECTION IN A MEMORY DEVICE

FIELD

The invention generally relates to an electronic memory system, and more specifically, to a system for providing voltage supply protection in a memory device, and a method for providing voltage supply protection in a memory device.

BACKGROUND

In many applications, for instance in many applications employing microcontrollers, there is a need for highly reliable memory devices, in particular non-volatile memory devices. In the automotive sector, for example, the need for such memory systems is constantly rising since modern vehicles comprise an increasing number of microcontrollers. These microcontrollers are used for such diverse purposes as engine and transmission control, advanced driver assistance systems, or infotainment systems. All these applications require memory to function. Since many of these applications relate to aspects relevant to safety, highly reliable memory is needed. Furthermore, such high quality memory systems not only need to function well under normal conditions, but should also be robust in the occurrence of faults.

A conventional memory device comprises a plurality of memory cells. In a non-volatile memory device these memory cells are non-volatile memory cells. In a Flash memory, for example, each of these non-volatile memory cells comprises a floating-gate transistor. A floating-gate transistor comprises a floating-gate which is electrically isolated from the other components of the floating-gate transistor. This floating-gate can therefore be used to store a charge for long periods of time. The amount of charge stored in a floating-gate is usually modified by mechanisms such as Fowler-Nordheim tunneling or hot-carrier injection. Modifying the amount of charge stored in a floating-gate therefore requires applying specific voltages to the terminals of the floating-gate transistor, i.e. to the drain, source, control gate, and bulk of the floating-gate transistor.

In addition to the floating-gate transistors, a Flash memory usually comprises a plurality of additional transistors. In particular, each memory cell may comprise an additional transistor which may be employed for selecting the respective memory cell for erasing, programming, or reading. Further additional transistors may be provided at specific positions in the memory array for performing specific tasks such as selecting certain sets of memory cells for erasing, programming, or reading. As a consequence, a Flash memory comprises a plurality of transistors, the terminals of which need to be provided with specific voltages in order to allow the transistors to function properly.

In a conventional non-volatile memory device the non-volatile memory cells are arranged in a regular grid, i.e. the memory cells are arranged in rows and columns. This arrangement allows for a simple management of the voltage supply lines required for providing each memory cell with the voltages needed for its operation. A conventional Flash memory may comprise a plurality of horizontal voltage supply lines coupled to the control gates of a row of floating-gate transistors. These horizontal voltage supply lines are generally referred to as word lines and the set of non-volatile memory cells coupled to a single word line is generally referred to as a page. A conventional Flash memory furthermore may comprise a plurality of vertical voltage supply lines coupled to drain terminals of a column of floating-gate transistors. These vertical voltage supply lines are generally referred to as bit lines. A conventional Flash memory may comprise additional voltage supply lines such as source lines or select lines.

A conventional Flash memory furthermore comprises voltage supply sources which are employed to provide the voltages required for operation of the Flash memory. These voltage supply sources are typically implemented as charge pumps.

Since non-volatile memories such as Flash memories are semiconductor devices exhibiting a large quantity of microscopic structures, single faults in the array of memory cells for example evolving only during the operation of the chip cannot always be avoided. A defect in a memory array may, however, result in a low resistive path on a high ohmic terminal which can lead to a catastrophic failure of a complete memory array. In particular, if the non-volatile memory device comprises voltage supply sources, such a low resistive path may result in erroneous voltages being supplied to the memory array.

For these or other reasons there is a need for an improved system and/or method for providing voltage supply protection in a memory device.

SUMMARY

In accordance with an aspect of the invention, there is provided a system for providing voltage supply protection in a memory device comprising a memory array comprising a plurality of memory cells arranged in a plurality of groups of memory cells, and a plurality of current limiting elements, wherein each group of memory cells is associated with at least one current limiting element.

In accordance with a further aspect of the invention, there is provided a method for providing voltage supply protection in a memory device, the method comprising supplying the memory array with a first voltage, and limiting a current flowing in the memory array.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated, as they become better understood by reference to the following detailed description.

FIG. 2 depicts a schematic representation of a non-volatile memory device according to an embodiment of the invention which exhibits a local fault in the memory array and comprises current limiting elements;

FIG. 5 depicts a schematic representation of a method of operating a non-volatile memory device according to an embodiment of the invention.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1A:
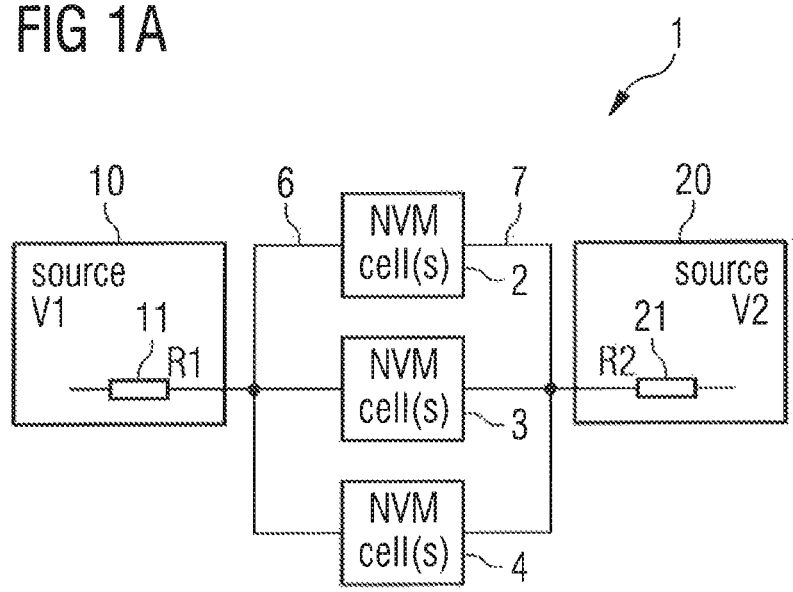
FIG. 1a depicts a schematic representation of a conventional non-volatile memory device comprising two voltage supply sources.

FIG. 1a shows a conventional non-volatile memory device 1 comprising a plurality of non-volatile memory cells (NVM cells). The non-volatile memory cells are grouped into a first group 2, a second group 3, and a third group 4 of non-volatile memory cells. Each group of NVM cells may correspond to a single page of the non-volatile memory. The non-volatile memory device 1 furthermore comprises a first voltage supply source 10 and a second voltage supply source 20. The first voltage supply source 10 has a first source resistance 11 and is configured to supply a first supply voltage V1. The second voltage supply source 20 has a second source resistance 21 and is configured to supply a second supply voltage V2. The first and second voltage supply sources 10 and 20 are typically implemented by charge pumps.

The groups of non-volatile memory cells 2, 3, and 4 are connected to the voltage supply sources 10 and 20 by a network of voltage supply lines. Any connection described here may be direct or indirect through additional elements such as switches or transistors. The groups of non-volatile memory cells 2, 3, and 4 are supplied by the first voltage supply source 10 with the first supply voltage V1 via a first set of voltage supply lines 6 and by the second voltage supply source 20 with the second supply voltage V2 via a second set of voltage supply lines 7. Therefore, each group of non-volatile memory cells 2, 3, and 4 is supplied with the first supply voltage V1 as well as with the second supply voltage V2. In normal configuration of the memory array, i.e. in a configuration free from defects, the first supply voltage V1 is separated from the second supply voltage V2 by the non-volatile memory cells.

In particular, if the non-volatile memory device 1 comprises a Flash memory comprising select transistors and floating-gate transistors, the first supply voltage V1 may be supplied to select gates of the select transistors and the second supply voltage V2 may be supplied to the bulk of the transistors, i.e. to a well common to most or all of the transistors. A third voltage might be supplied to control gates of the floating-gate transistors. Depending on the operational state of the non-volatile memory device 1, the respective voltages will have specific values. For reading, for example, the first supply voltage V1 supplied to the select gates might have a value of 3.5 V, whereas the second supply voltage V2 supplied to the well might have a value of 0 V. For erasing, for example, the first supply voltage V1 might have a value of 14 V, whereas the second supply voltage V2 might have a value of 6 V and the third voltage might have a value of −5 V.

Figure 1B:
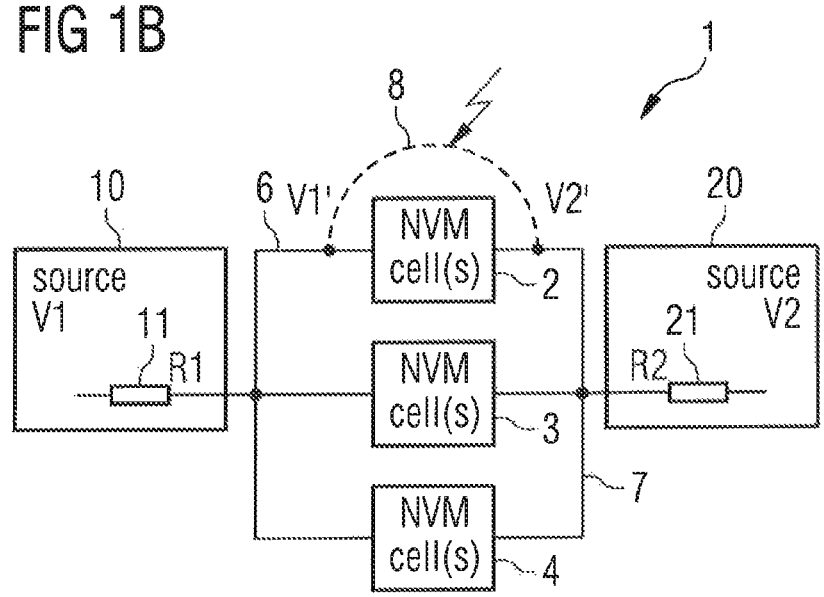
FIG. 1b depicts a schematic representation of a conventional non-volatile memory device exhibiting a local fault in the memory array.

Due to a defect in the memory array, however, the two normally separated supply voltages V1 and V2 may get shorted. Such a situation is depicted in FIG. 1b. In the non-volatile memory device 1 shown in FIG. 1b a low resistive path 8 has been formed due to a defect in the first group 2 of non-volatile memory cells. This low resistive path 8 may have a resistance of 2-3 k$\Omega$, for example. Therefore, the two normally separated supply voltages V1 and V2 got shorted, resulting in two erroneous voltages V1' and V2' being supplied to the first group 2 of non-volatile memory cells instead of the two supply voltages V1 and V2. The exact values of the resulting erroneous voltages V1' and V2' will depend on the source resistances 11 and 21 of the voltage supply sources 10 and 20 and on the resistance of the short. Furthermore, the currents I1 and I2 generated by the first 10 and second 20 voltage supply sources, respectively, are increased because the voltage supply sources drive against each other.

Due to the layout of the voltage supply lines, the erroneous voltages V1' and V2' are not only supplied to the first group 2 of non-volatile memory cells, but are also supplied to the second 3 and third 4 groups of non-volatile memory cells. Therefore, the supply voltages are disturbed in the whole array and not only at the damaged location. As a consequence, the low resistive path 8 in the first group 2 of non-volatile memory cells may lead to a catastrophic failure of the complete memory array.

To avoid this, the non-volatile memory device according to the invention comprises at least one current limiting element. FIG. 2 shows a non-volatile memory device 1 according to a first embodiment of the invention. Although this embodiment as well as the embodiments subsequently described and illustrated herein refer to a non-volatile memory device, it is to be understood that the present invention may be equally implemented in a volatile memory device. The non-volatile memory device 1 shown in FIG. 2 differs from the device shown in FIG. 1b in that it comprises several current limiting elements; the further components of this device may be identical or similar to the components of the non-volatile memory device 1 shown in FIGS. 1a and 1b and described above. The current limiting elements are integrated into the voltage supply lines connecting the groups of non-volatile memory cells to the first voltage supply source. In particular, a first current limiting element 22 is integrated into the voltage supply line 12 connecting the first group 2 of non-volatile memory cells to the first voltage supply source 10. Analogously, a second current limiting element 23 and a third current limiting element 24 are integrated into voltage supply lines 13 and 14, respectively.

Integration of the current limiting elements 22, 23, and 24 into the voltage supply lines 12, 13, and 14, i.e. into each path connecting the groups 2, 3, and 4 of non-volatile memory cells to the first voltage supply source 10, allows for limitation of the current flowing through a short in one of the groups 2, 3, or 4 of non-volatile memory cells. In the embodiment shown in FIG. 2, a low resistive path is formed by a defect in the first group 2 of non-volatile memory cells. As a result, the first group 2 of non-volatile memory cells is no longer supplied with the second supply voltage V2 and the first supply voltage V1, but is instead supplied with the second supply voltage V2 and with the erroneous voltage V1'. Due to the low resistive path 8 formed in the first group 2 of non-volatile memory cells, the erroneous voltage V1' is similar to the second supply voltage V2. In cases where the resistance of the low resistive path is negligible, the erroneous voltage V1' equals the second supply voltage V2.

The first current limiting element 22 integrated into the voltage supply line 12 connecting the first voltage supply source 10 to the first group 2 of non-volatile memory cells prevents the first voltage supply source 10 from supplying the groups of non-volatile memory cells with an erroneous voltage. Instead, due to the current limiting element 22, the first voltage supply source 10 still supplies the memory array with the first supply voltage V1, even in the presence of a low resistive path 8 in the first group 2 of non-volatile memory cells. By limiting the current that can flow through the low resistive path 8 from the first voltage supply source 10 to the second voltage supply source 20 and/or from the second voltage supply source 20 to the first voltage supply source 10, the first current limiting element 22 prevents the two voltage supply sources 10 and 20 from driving against each other. In particular, the first current limiting element 22 makes sure that the currents I1 and I2 generated by the first 10 and second 20 voltage supply sources, respectively, do not increase uncontrollably.

As explained above, due to the presence of the first current limiting element 22 the first voltage supply source 10 still supplies the memory array with the first supply voltage V1, despite the low resistive path 8 in the first group 2 of non-volatile memory cells. As a consequence, the second 3 and third 4 groups of non-volatile memory cells which are free from defects and therefore do not comprise a low resistive path, are still supplied by the first voltage supply source 10 with the first supply voltage V1 via the second 13 and third 14 voltage supply lines, respectively, and by the second voltage supply source 20 with the second supply voltage V2 via the second set of voltage supply lines 7. Therefore, the second 3 and third 4 groups of non-volatile memory cells are still supplied with the supply voltages V1 and V2, i.e. with the two voltages they require in order to function properly. Thus, the second 3 and third 4 groups of non-volatile memory cells still work even though the first group 2 of non-volatile memory cells is defective. As a result, the first current limiting element 22 integrated into the first voltage supply line 12 ensures that a low resistive path 8 which is caused by a defect in the first group 2 of non-volatile memory cells does not lead to a failure of the complete memory array.

Of course a defect resulting in a low resistive path cannot only occur in the first group 2 of non-volatile memory cells, but might instead or in addition occur in one or both of the second 3 or third 4 groups of non-volatile memory cells. To ensure that such a defect does not lead to a failure of the complete memory array, the non-volatile memory device 1 shown in FIG. 2 comprises a second current limiting element 23 as well as a third current limiting element 24. In the embodiment depicted in FIG. 2, the second 23 and third 24 current limiting elements are integrated into the second 13 and third 14 voltage supply lines, respectively, i.e. each path connecting one of the groups 2, 3, 4 of non-volatile memory cells to the first voltage supply source 10 comprises a current limiting element.

In a further embodiment of the invention, each path connecting one of the groups 2, 3, 4 of non-volatile memory cells to the second voltage supply source 20 comprises a current limiting element. In another embodiment of the invention, each path connecting one of the groups 2, 3, 4 of non-volatile memory cells to either one of the first 10 or second 20 voltage supply sources comprises a current limiting element. A non-volatile memory device according to the invention may comprise more than three groups of non-volatile memory cells. In one embodiment, the non-volatile memory device then comprises a plurality of current limiting elements, each associated with one of these groups.

Figure 3A:
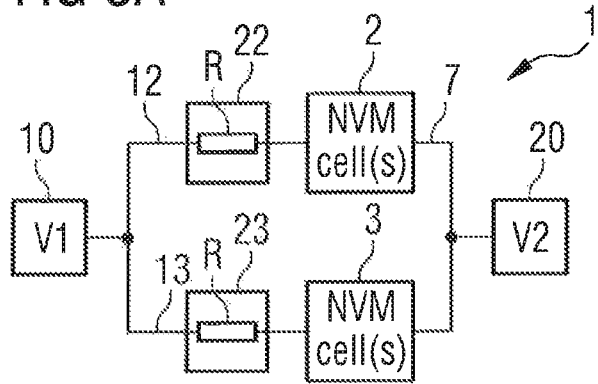
FIG. 3a depicts a schematic representation of a non-volatile memory device according to an embodiment of the invention which comprises current limiting elements implemented by resistors.

FIG. 3a shows a non-volatile memory device 1 according to a further embodiment of the invention, demonstrating how the current limiting elements might be implemented. This non-volatile memory device 1 again comprises first and second voltage supply sources 10 and 20 and non-volatile memory cells grouped into a first group 2 and a second group 3 of non-volatile memory cells. The non-volatile memory device furthermore comprises a first resistor 22 acting as first current limiting element and a second resistor 23 acting as second current limiting element. The first resistor 22 is integrated into the voltage supply line 12 connecting the first group 2 of non-volatile memory cells to the first voltage supply source 10 and the second resistor 23 is integrated into the voltage supply line 13 connecting the second group 3 of non-volatile memory cells to the first voltage supply source 10. The first 2 and second 3 groups of non-volatile memory cells are furthermore connected to the second voltage supply source 20 by a set of voltage supply lines 7. Employing resistors as current limiting elements allows for reliable limitation of currents and for simple manufacturability of the non-volatile memory device. In one embodiment, the resistors are implemented as switched capacitors.

Figure 3B:
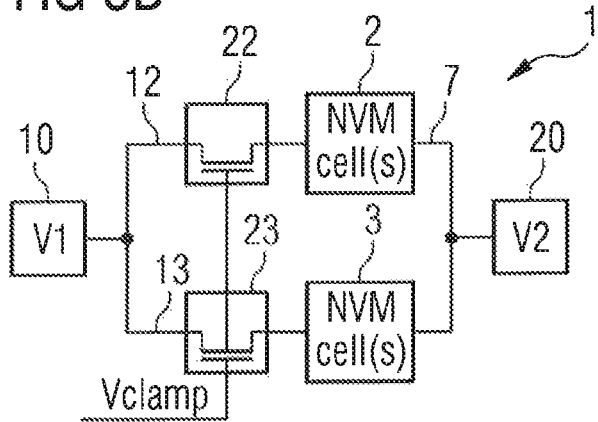
FIG. 3b depicts a schematic representation of a non-volatile memory device according to an embodiment of the invention which comprises current limiting elements implemented by transistors.

FIG. 3b shows a non-volatile memory device 1 according to a further embodiment of the invention similar to the one of FIG. 3a. The embodiment of FIG. 3b differs from the embodiment of FIG. 3a by employing pass transistors as current limiting elements 22 and 23. Each of the pass transistors comprises a gate to which a clamp voltage Vclamp is applied. The value of the clamp voltage Vclamp is chosen to allow the pass transistors to efficiently limit the current flowing from the first voltage supply source 10 to the first 2 and/or second 3 group of non-volatile memory cells. The exact value appropriate for this purpose depends on the characteristics of the pass transistors. The clamp voltage Vclamp applied to the gates of the pass transistors is generated by a current mirror in one embodiment.

Figure 3C:
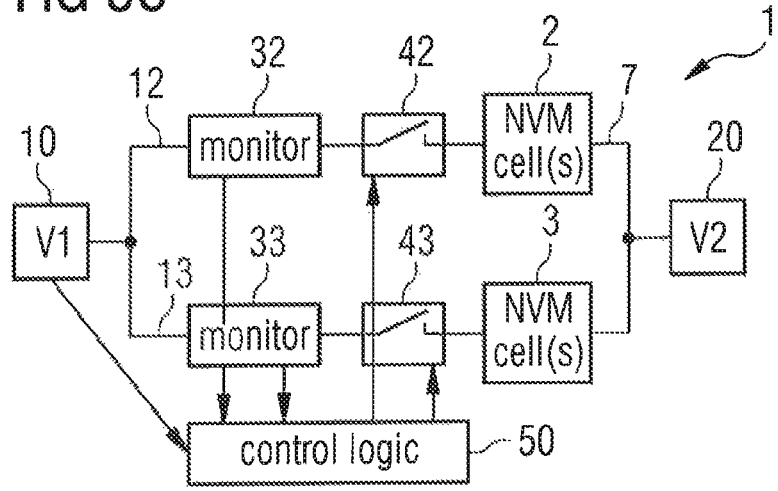
FIG. 3c depicts a schematic representation of a non-volatile memory device according to an embodiment of the invention which comprises current limiting elements implemented by switches, monitors, and a control logic.

FIG. 3c shows a non-volatile memory device 1 according to a further embodiment of the invention. In this embodiment the non-volatile memory device 1 comprises first and second monitors 32 and 33, first and second switches 42 and 43, and a control logic 50. The monitors 32 and 33, the switches 42 and 43, and the control logic 50 implement the current limiting elements. To this end, first monitor 32 and first switch 42 are integrated into the voltage supply line 12 connecting the first group of non-volatile memory cells 2 to the first voltage supply source 10, and second monitor 33 and second switch 43 are integrated into the voltage supply line 13 connecting the second group of non-volatile memory cells 3 to the first voltage supply source 10. The monitors 32 and 33, the switches 42 and 43, and, in one embodiment the first voltage supply source 10, are connected to the control logic 50. The first and second switches 42 and 43 are adapted to selectively connect the first voltage supply source 10 to the first and second groups of non-volatile memory cells 2 and 3, respectively. The monitors 32 and 33 are adapted to monitor parameters indicative of a defect in the memory array. In one embodiment, each monitor 32/33 is adapted to monitor the current flowing through the respective voltage supply line 12/13 between the first voltage supply source 10 and the first 2 or second 3 group of non-volatile memory cells. In another embodiment, each monitor 32/33 is adapted to monitor a voltage between two given points of the first 12 or second 13 voltage supply lines, respectively. The monitors 32 and 33 may also be adapted to monitor a current and a voltage. Furthermore, the monitors 32 and 33 may be adapted to monitor the activity of the first voltage supply source 10. In particular, if the first voltage supply source 10 is implemented as a charge pump, the monitors 32 and 33 may be implemented as pump monitors.

The values of the parameters monitored by the monitors 32 and 33 are fed into the control logic 50. The control logic 50 is configured to recognize faults, e.g. local defects, in the memory array, i.e. in the first 2 or second 3 group of non-volatile memory cells, based on the values of the parameters provided by the first 32 and second 33 monitors. When the control logic 50 detects a fault in the first 2 or the second 3 group of non-volatile memory cells, it activates the respective switch, i.e. the first 42 or the second 43 switch, in order to disconnect the defective group of non-volatile memory cells, i.e. the first 2 or the second 3 group, from the first voltage supply source 10. Thus, if for instance there is a defect in the first group 2 of non-volatile memory cells resulting in a low resistive path, the current flowing through the first voltage supply line 12 will increase. This increase in current will be detected by the first monitor 32 and reported to the control logic 50. If the value reported to the control logic 50 from the first monitor 32 exceeds a predetermined threshold, the control logic 50 will conclude that there is a defect in the first group 2 of non-volatile memory cells and will, as a consequence, activate the first switch 42 in order to disconnect the first group 2 of non-volatile memory cells from the first voltage supply source 10.

In one embodiment of the invention the control logic 50 is configured to select groups of non-volatile memory cells one by one in order to detect defective groups. Therefore, the control logic 50 may in a first step activate the first monitor 32 to allow monitoring of a parameter indicative of a defect in the first group 2 of non-volatile memory cells. If a defect is detected, the first switch 42 will be activated to disconnect the first group 2 of non-volatile memory cells from the first voltage supply source 10. In a further step the control logic 50 may then activate the second monitor 33 to allow monitoring of a parameter indicative of a defect in the second group 3 of non-volatile memory cells. In this way, the groups of non-volatile memory cells constituting the memory array may be sequentially monitored.

Figure 4:
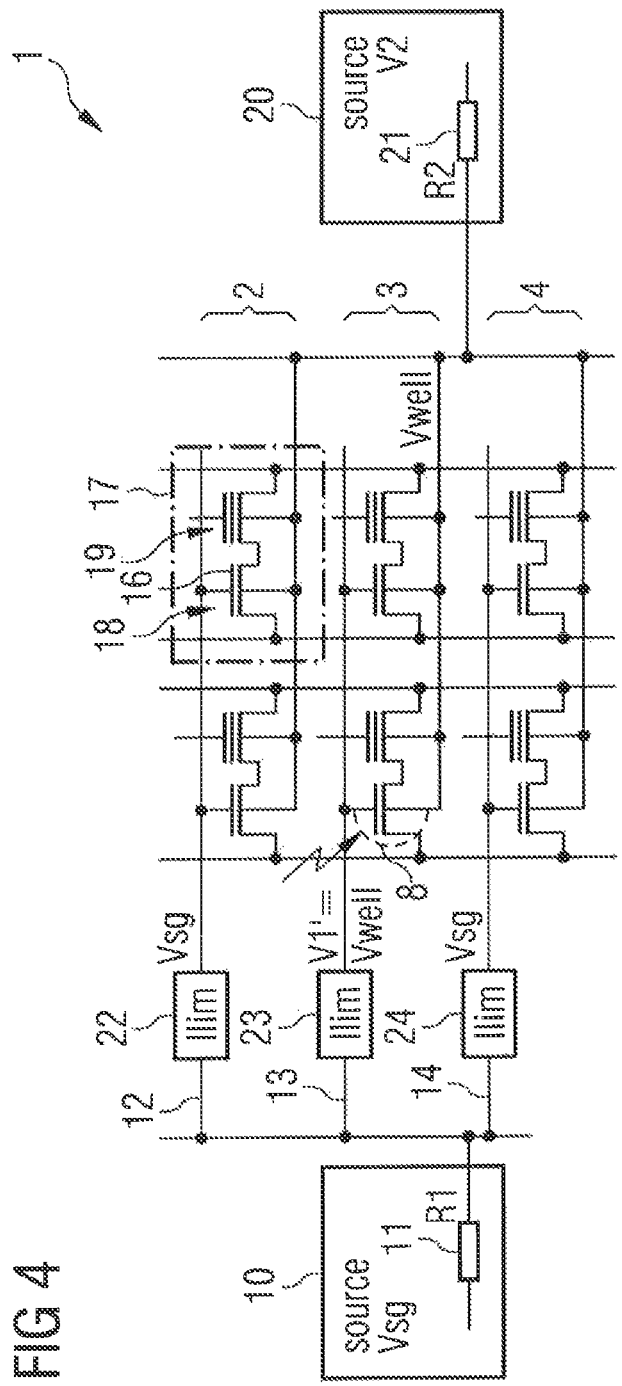
FIG. 4 depicts a schematic representation of a non-volatile memory device according to an embodiment of the invention showing in greater detail the layout of the memory array.

FIG. 4 shows a non-volatile memory device 1 according to a further embodiment of the invention. In this embodiment the memory array comprises a plurality of non-volatile memory cells 17. Each NVM cell 17 comprises a select transistor 18 and a floating-gate transistor 19. The floating-gate of the floating-gate transistor 19 can be used to store a charge for long periods of time. Consequently, each floating-gate transistor 19 can be used to store at least one bit of information. Each select transistor 18 comprises a select gate 16. The select transistor 18 enables selection of a single NVM cell 17 for reading, programming, or erasing. The NVM cells of the memory array shown in FIG. 4 are grouped into a first group 2, a second group 3, and a third group 4 of NVM cells. In each group of NVM cells, the select gates of the select transistors of the NVM cells constituting this group of NVM cells are connected to common voltage supply lines. In particular, the select gates of the select transistors of the NVM cells of the first group of NVM cells are connected to a first voltage supply line 12. Analogously, the select gates of the second 3 and third 4 group are connected to a second 13 and third 14 voltage supply line, respectively.

A current limiting element is integrated into each of these voltage supply lines, i.e. a first 22, second 23 and third 24 current limiting element is integrated into the first 12, second 13, and third 14 voltage supply line, respectively. Alternatively, or additionally, current limiting elements may be integrated into the word-lines, i.e. into the lines supplying the control gates of the floating-gate transistors with voltage. The first 12, second 13, and third 14 voltage supply lines are coupled to a first voltage supply source 10 comprising a first source resistance 11 and providing a first voltage Vsg. The first voltage supply source 10 may be a relatively weak charge pump. The transistors of the NVM cells are arranged to share the same well, i.e. the transistors of the NVM cells are arranged on a uniformly doped region of semiconductor substrate. This common well is connected to a second voltage supply source 20 which comprises a second source resistance 21 and provides a second voltage Vwell. The second voltage supply source 20 may be a relatively strong charge pump.

In the memory array of the non-volatile memory device 1 shown in FIG. 4 a low resistive path 8 is formed in the select transistor of one of the NVM cells of the second group 3 of NVM cells. The low resistive path 8 may be due to an oxide breakdown between the select gate and the well of the select transistor, for example. This low resistive path 8 results in an erroneous voltage V1' being supplied to the select gates of the select transistors of the NVM cells of the second group 3 of NVM cells. If the resistance of the low resistive path 8 is negligible, the erroneous voltage V1' will be very close to the second voltage Vwell provided by the second voltage supply source 20 which is provided to the common well. Due to the second current limiting element 23 this erroneous voltage V1' cannot spread to the first 2 or third 4 group of NVM cells, but does instead only affect the second group 3 of NVM cells. Therefore, the current limiting elements ensure that a defect in an NVM cell in a given group of NVM cells affects this group only and does not affect the complete memory array. Consequently, while the affected group will fail, the other groups will still be available for use. As a result, integration of current limiting elements enables a still undisturbed operation of the groups of NVM cells that are not directly affected by the fault, resulting in a gained robustness of the system against local faults.

FIG. 5 depicts an example method of operating a non-volatile memory device according to one embodiment of the invention. The respective non-volatile memory device comprises a non-volatile memory array comprising a plurality of non-volatile memory cells arranged in a plurality of groups of non-volatile memory cells, a plurality of current limiting elements, and a plurality of monitoring devices, wherein at least one current limiting element and at least one monitoring device is associated with each group of non-volatile memory cells. The method comprises supplying the non-volatile memory array with a first voltage at 102, and monitoring with a monitoring device a parameter indicative of a defect in the group on non-volatile memory cells associated with the monitoring device at 104. The method further comprises evaluating the parameter at 106, assessing whether evaluation of the parameter indicates a defect at 108, and, if yes, limiting a current at 110. If at 108 the determination is no, the method comprises going back to 104.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system for providing voltage supply protection in a memory device comprising:
   a memory array comprising a plurality of memory cells arranged in a plurality of groups of memory cells;
   a control logic;
   at least one monitoring device, wherein the at least one monitoring device is configured to monitor a parameter indicative of a defect in the memory array; and
   at least one current limiting element,
   wherein at least one group of memory cells of the plurality of groups of memory cells is associated with the at least one current limiting element,
   wherein the current limiting element comprises a switching element; and
   wherein the control logic is configured to receive signals from the at least one monitoring device and control the at least one current limiting element in response thereto.

2. The system of claim 1, wherein the memory device comprises a non-volatile memory device, the memory array comprises a non-volatile memory array, and the memory cells comprise non-volatile memory cells.

3. The system of claim 1, further comprising:
   a first voltage supply source, wherein the at least one group of memory cells of the plurality of groups of memory cells is connected to the first voltage supply source by a respective voltage supply line.

4. The system of claim 3, wherein the voltage supply line comprises the at least one current limiting element.

5. The system of claim 4, further comprising:
   a second voltage supply source connected to the at least one group of memory cells of the plurality of groups of memory cells.

6. The system of claim 5, wherein the first voltage supply source comprises a first charge pump and the second voltage supply source comprises a second charge pump, and wherein the current limiting element is configured to ensure that the first and second charge pumps do not drive against each other in the presence of a defect in the memory array.

7. The system of claim 5, wherein the current limiting element is configured to isolate the first voltage supply source from the second voltage supply source in the presence of a defect in the memory array.

8. The system of claim 1, wherein the switching element is a transistor.

9. The system of claim 1, wherein the monitoring device is configured to monitor the parameter associated with the at least one group of memory cells.

10. The system of claim 9, wherein the parameter comprises a current or voltage or an impedance.

11. A system for providing voltage supply protection in a non-volatile memory device comprising:
    a non-volatile memory array comprising a plurality of non-volatile memory cells arranged in a plurality of groups of non-volatile memory cells;
    at least one current limiting element;
    at least one monitoring device, wherein the at least one monitoring device is configured to monitor a parameter indicative of a defect in the non-volatile memory array; and
    a control logic configured to receive signals from the at least one monitoring device and control the at least one current limiting element in response thereto,
    wherein the at least one current limiting element and the at least one monitoring device is associated with a respective group of non-volatile memory cells of the plurality of groups of non-volatile memory cells.

12. The system of claim 11, wherein the monitoring device is configured to monitor the parameter indicative of a defect in the group of non-volatile memory cells associated with the monitoring device.

13. The system of claim 12, wherein current limiting element is configured to limit a current if evaluation of the parameter by the monitoring device indicates a defect in the respective group of non-volatile memory cells of the plurality of groups of non-volatile memory cells.

14. A system for providing voltage supply protection in a non-volatile memory device comprising:
    means for storing data in a non-volatile manner;
    means for providing a first voltage;
    means for connecting the means for storing data in a non-volatile manner to the means for providing a first voltage;
    means for detecting a fault condition in the means for storing data in a non-volatile manner;
    means for limiting a current in the means for storing data in a non-volatile manner; and
    means for receiving signals from means for detecting a fault condition in the means for storing data in a non-volatile manner and controlling the means for limiting a current in the means for storing data in a non-volatile manner in response thereto,
    wherein the means for limiting a current is integrated into the means for connecting the means for storing data in a non-volatile manner to the means for providing a first voltage.

15. The system of claim 14, furthermore comprising:
    means for providing a second voltage; and
    means for connecting the means for storing data in a non-volatile manner to the means for providing a second voltage,
    wherein the means for limiting a current is adapted to isolate the first voltage from the second voltage in the event of a detected fault condition.

16. A method of providing voltage supply protection in a memory device comprising a memory array, the method comprising:
    supplying the memory array with a first voltage;
    monitoring a parameter indicative of a defect in the memory array;
    evaluating the parameter indicative of a defect in the memory array by a control logic;
    selectively limiting a current flowing in the memory array based on the evaluation if the evaluation indicates a defect in the memory array.

17. The method of claim 16, wherein the memory device comprises a non-volatile memory device and the memory array comprises a non-volatile memory array.

18. The method of claim 16, wherein the current flows through a defect in the memory array.

19. The method of claim 18, wherein the first voltage is supplied to word-lines of the memory array.

20. The method of claim 18, further comprising supplying the memory array with a second voltage.

21. The method of claim 20, wherein the first voltage is supplied by a first voltage supply source comprising a first charge pump and the second voltage is supplied by a second voltage supply source comprising a second charge pump, and wherein the current flowing in the memory array is limited in a manner to ensure that the first and second charge pumps do not drive against each other in the presence of a fault condition in the memory array.

22. A method of operating a non-volatile memory device, the non-volatile memory device comprising a non-volatile memory array comprising a plurality of non-volatile memory cells arranged in a plurality of groups of non-volatile memory cells,
- wherein at least one current limiting element and at least one monitoring device is associated with at least one group of non-volatile memory cells of the plurality of groups of non-volatile memory cells, the method comprising:
- supplying the non-volatile memory array with a first voltage;
- monitoring with the at least one monitoring device a parameter indicative of a defect in the group of non-volatile memory cells associated with the monitoring device; and
- evaluating by a control logic, the parameter indicative of a defect in the group of non-volatile memory cells.

23. The method of claim 22, further comprising:
- evaluating the parameter; and
- if evaluation of the parameter indicates a defect in the group of non-volatile memory cells, limiting a current with the at least one current limiting element associated with the group of non-volatile memory cells.

24. The method of claim 23, wherein the parameter relates to a current or a voltage or an activity of a charge pump.

25. The method of claim 23, further comprising supplying the non-volatile memory array with a second voltage, wherein the first voltage is supplied by a first voltage supply source and the second voltage is supplied by a second voltage supply source, and wherein the current limiting elements are configured to separate the first voltage supply source from the second voltage supply source.

* * * * *